(12) United States Patent
Thomas et al.

(10) Patent No.: US 8,105,408 B2
(45) Date of Patent: Jan. 31, 2012

(54) PRESSURE EQUALISATION DEVICE

(75) Inventors: Alan Thomas, Wiltshire (GB); Colin Gradwell, Wiltshire (GB); Mark Hemmings, Wiltshire (GB)

(73) Assignee: Knorr-Bremse Rail Systems (UK) Ltd., Melksham, Wiltshire (GB)

( * ) Notice: Subject to any disclaimer, the term of this patent is extended or adjusted under 35 U.S.C. 154(b) by 0 days.

(21) Appl. No.: 12/905,188

(22) Filed: Oct. 15, 2010

(65) Prior Publication Data

US 2011/0049399 A1 Mar. 3, 2011

Related U.S. Application Data

(63) Continuation of application No. 10/556,167, filed as application No. PCT/GB2004/002015 on May 10, 2004.

(30) Foreign Application Priority Data

May 9, 2003 (GB) .................................. 0310701.8

(51) Int. Cl.
*B01D 51/00* (2006.01)
(52) U.S. Cl. ....... 55/420; 96/4; 96/6; 454/270; 454/271; 454/340
(58) Field of Classification Search .................. 55/420; 96/4, 6, 155; 174/17 VA; 215/308, 902; 454/270, 271, 340
See application file for complete search history.

(56) References Cited

U.S. PATENT DOCUMENTS

| | | | |
|---|---|---|---|
| 259,682 A * | 6/1882 | Gruber | 217/104 |
| 1,888,150 A | 11/1932 | Walker | |
| 1,997,365 A * | 4/1935 | Howard | 137/513.5 |
| 2,113,454 A * | 4/1938 | Mitchell | 429/84 |
| 3,519,012 A | 7/1970 | Patten | |
| 3,631,654 A * | 1/1972 | Riely et al. | 96/6 |
| 3,668,837 A | 6/1972 | Gross | |
| 3,909,302 A * | 9/1975 | Mermelstein | 429/86 |
| 4,238,207 A | 12/1980 | Ruschke | |
| 4,445,884 A | 5/1984 | Kutz et al. | |
| 4,773,222 A | 9/1988 | Totoki et al. | |
| 5,348,570 A | 9/1994 | Ruppert et al. | |
| 5,381,563 A | 1/1995 | Isabelle et al. | |
| 5,522,769 A | 6/1996 | DeGuiseppi | |
| 6,346,130 B2 | 2/2002 | Suzuki | |
| 6,464,425 B1 | 10/2002 | Closkey | |
| 6,497,248 B2 * | 12/2002 | Herz | 137/516.29 |
| 6,726,399 B2 | 4/2004 | Heeks et al. | |
| 6,835,235 B2 | 12/2004 | Pilgram et al. | |
| 6,904,933 B2 * | 6/2005 | Oyamada | 137/541 |
| 7,166,024 B2 * | 1/2007 | Mashiko et al. | 454/370 |
| 7,357,709 B2 * | 4/2008 | Zukor et al. | 454/270 |
| 7,626,129 B2 * | 12/2009 | Sasaki et al. | 174/520 |
| 2002/0170432 A1 | 11/2002 | Cartellone | |
| 2003/0216119 A1 * | 11/2003 | Mashiko et al. | 454/275 |

FOREIGN PATENT DOCUMENTS

EP 377067 A1 * 7/1990

OTHER PUBLICATIONS

Machine translation of Hofner et al. (EP 377067 A1).* Machine translation of Hofner et al. (EP 377067 A1, Jul. 1990).*

* cited by examiner

*Primary Examiner* — Jason M Greene
*Assistant Examiner* — Anthony Shumate
(74) *Attorney, Agent, or Firm* — Barnes & Thornburg LLP

(57) ABSTRACT

A pressure equalization device adapted to be operatively connected to an enclosure, the device including an air passage which, when the device is so connected to the enclosure, provides a fluid communication between the interior of the enclosure and atmosphere, the air passage containing a barrier wall comprising an air permeable membrane forming a micro-particulate filter.

9 Claims, 1 Drawing Sheet

PRESSURE EQUALISATION DEVICE

CROSS-REFERENCE TO RELATED APPLICATIONS

The present application is a continuation of a national phase U.S. application Ser. No. 10/556,167, which claims priority to International Patent Application No. PCT/GB 2004/002015 filed May 10, 2004, the contents of which are incorporated herein by reference in their entirety.

BACKGROUND AND SUMMARY

The present invention relates to a pressure equalisation device adapted to be operatively connected to an enclosure to ensure that, during operation, the pressure in the enclosure is substantially equal to atmospheric pressure at all times.

In many situations, sensitive equipment, such as electrical equipment, printed circuits, pneumatic control circuits and hydraulic control circuits, is used in exposed environmental conditions, from which the equipment must be protected. In many cases, the problem is solved by encasing the equipment entirely in a protective enclosure which is completely sealed from the exterior atmosphere. However, such a solution is not possible where the equipment to be protected includes pressure members or transducers which are required to be responsive to atmospheric pressure. Atmospheric pressure, of course, varies with atmospheric conditions and this problem is compounded when the equipment is used on a vehicle whose height above sea level can vary throughout each journey. In such installations, it is necessary to have the interior of a protective enclosure vented to atmosphere through an air vent or pressure equalisation device to ensure that the air pressure within the protective enclosure is maintained substantially at atmosphere.

Particularly, when mounted on vehicles such as rail cars, the enclosure and the air vents are subjected to a harsh environment which includes dust and water and it is necessary to exclude such foreign matter from entering the enclosure through the pressure equalisation device, to prevent damage to the equipment inside the enclosure.

The present invention seeks to provide a solution to this problem and, particularly but not essentially, to provide a pressure equalisation device for an enclosure which can meet the requirements of BS EN 60529: 1992 IP 66. IP 66 is an industry standard for instrument protection, the first digit indicating a level of protection against solid objects, 6 being no ingress of dust possible, the second digit indicating a level of protection against liquids, 6 being protection against powerful jets of water.

According to the present invention there is provided a pressure equalisation device adapted to be operatively connected to an enclosure, the device including an air passage which, when the device is so connected to the enclosure, provides a fluid communication between the interior of the enclosure and atmosphere, the air passage containing a barrier wall comprising an air permeable membrane forming a particulate filter.

Preferably, the barrier wall extends across the air passage and a predetermined distance along the passage so as to have an area subjected to the air flow which is greater than the cross-sectional area of the passage.

Preferably, the device comprises a carrier for the barrier wall, the carrier being sealingly insertable in a bore in a wall of the enclosure, the air passage being formed in part by said bore.

The permeable membrane preferably forms a micro particulate filter, which may be formed of a polymer material.

Preferably, the barrier wall also forms a water barrier preventing the increase of water into the enclosure. The device may also include a baffle means to inhibit water entering the air passage. When the device comprises a carrier for the barrier wall, the baffle may serve to clamp the carrier to the enclosure.

The device preferably includes a second air passage in parallel with the first air passage for venting the enclosure, the second air passage including a one-way vent valve adapted to permit air flow out of the enclosure through said second air passage but to prevent air flowing into the enclosure through said second air passage. Preferably, the second air passage is formed in said carrier, the one-way vent valve comprising a resilient diaphragm biased to close said second air passage and being urged to a closed position by air flowing in a direction towards the enclosure and being opened against the resilient bias by air flowing out of the enclosure.

BRIEF DESCRIPTION OF THE DRAWINGS

A preferred embodiment of the present invention will now be described by way of example with reference to the accompanying drawings, in which.

DETAILED DESCRIPTION OF THE DRAWINGS

Figure 2:
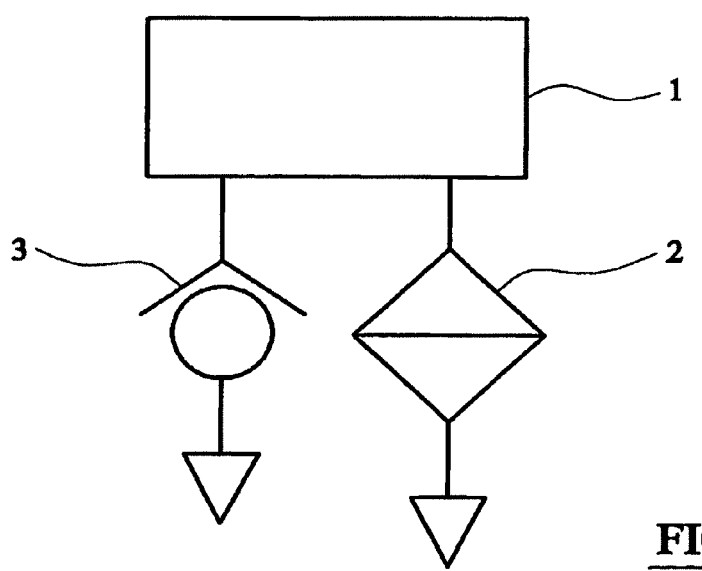
FIG. 2 shows a schematic form of a vent arrangement and a sealed enclosure.

Referring now to FIG. 2 there is shown a schematic layout of an embodiment of the present invention, for providing pressure equalisation between the interior of a sealed enclosure 1 and atmosphere. The pressure equalisation device comprises an air permeable device 2 which permits air to flow to and from the interior of the enclosure and a one-way vent valve 3 which permits air to flow out of the interior of the enclosure 1 but prevents air from flowing into the enclosure 1.

Figure 1:
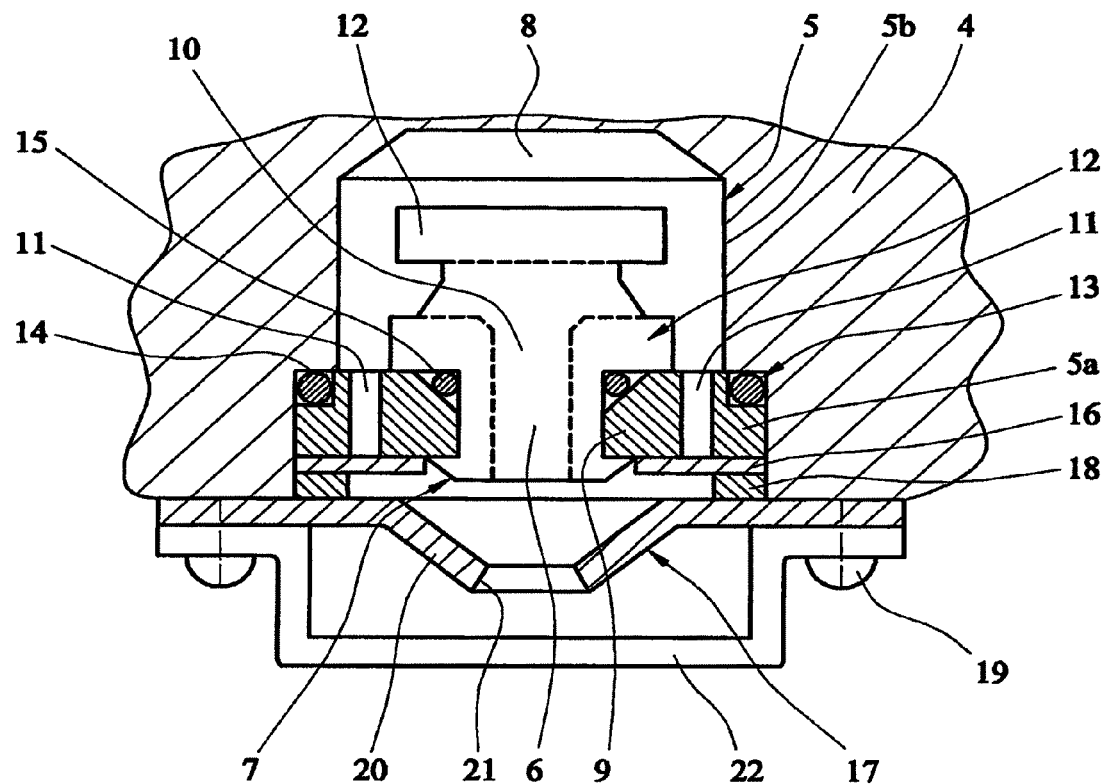
FIG. 1 shows a cross-section through a pressure equalisation device.

Referring now to FIG. 1, there is shown in schematic form a cross-sectional view of a pressure equalisation device 2 incorporated in a wall 4 of a sealed enclosure 1. In this particular embodiment, the sealed enclosure 1 comprises the housing wall 4 of an air pressure operated brake control valve for a railway braking system, which contains gauge pressure sensitive components, but which will not be described in any more detail.

The housing wall 4 has a stepped bore 5 providing an air passage 6 having an inlet 7 exposed to atmospheric pressure and an outlet 8 leading into the interior of the enclosure. The larger diameter portion 5a of the bore 5 contains an annular carrier 9 having a central opening 10 which defines the first air passage 6, and a plurality of axially extending bores 11 arranged about the carrier 9 on a diameter smaller than the smaller diameter 5b of the stepped bore 5 in the housing and which form a second air passage.

On the side of the carrier 9 leading towards the interior of the enclosure, the first air passage is closed by an air permeable membrane 12 which extends along the axial direction of the air passage 6 towards the interior of the enclosure 1 so that the surface area of the membrane which is subjected to the passage of air is substantially greater than the cross-sectional area of the opening 10 in the carrier 9. The membrane 12 is formed of a microporous polymer which is air permeable but provides a micro-particulate filter to prevent any dust entering the enclosure through the air passage 6. A suitable material is sold by W L Gore Inc. under the Trademark GORE-TEX. The membrane is preformed in a semi-rigid condition so that it overlies the carrier 9 and maintains its shape in the installed condition in which it is clip-fastened into the opening 10 in the carrier 9 for ease of assembly. The carrier 9 is sealed in the stepped bore 5a by an annular ring seal 13 located between the carrier 9 and the shoulder 14 of the stepped bore 5 whilst a further annular ring seal 15 is located between the wall of the opening on the carrier 9 and the membrane 12 to prevent the ingress of air past the membrane 12. A resilient annular silicon rubber diaphragm 16 is located on the outside of the carrier 9 and is clamped in position through a spacer 18 by a baffle plate 17 secured to the outer surface of the wall of the enclosure by screws 19.

The diaphragm 16 forms a one-way check valve for the second air passage formed by the bores 11. In its normal position the diaphragm 16 lies against the face of the carrier 9 to close the second air passage, as shown. When a substantial quantity of air flows from the interior of the enclosure 1 towards atmosphere, the resilient diaphragm deflects to open the second air passage. In the absence of a substantial air flow, the diaphragm lies in its closed position to close the second air passage but if air flows in the inward direction towards the interior of the housing, the higher external pressure urges the diaphragm 16 against the surface of the carrier 9 to securely and air tightly close the bores 11. In this way, in normal circumstances where the device balances the minor fluctuations in pressure differential which occur due to atmospheric conditions and changes in height of the vehicle, the second air passage remains closed but if there is, for example, a failure in the braking system which results in the generation of high pressure in the interior of the enclosure, this high pressure is vented through the second air passage, which minimises the risk of damage being caused to the barrier wall 12.

The baffle plate 17 has an outwardly extending frusto-conical section 20 axially aligned with the opening 6 in the carrier and having a central bore 21 through which air can flow into the pressure equalisation device. Outside this the baffle plate is shielded by a further, channel-shaped baffle 22 which is also secured to the enclosure housing wall 4.

In operation, the pressure in the interior of the enclosure is maintained at atmospheric pressure by air passing in the appropriate direction through the barrier wall 12. The microparticulate filter characteristic of the membrane prevents the ingress of any dust into the enclosure. In the working condition, when installed on a railway vehicle, the enclosure 1 is subjected to water impact, which can impinge on the housing with a great force as a jet of water if the vehicle passes through standing water, for example, at high-speed. To prevent this impinging directly on the membrane, which is designed to prevent water passing therethrough, a first line of defence is provided by the channel shaped baffle plate 22 which prevents water impinging directly on the membrane 12. Water can pass along the channel flowing laterally of the axis of the first air passage 6 so that to enter the air passage it must change direction by 90 degrees and flow up through the opening in the inner baffle plate 17 before impinging on the membrane 12. In this way, the vast majority of the force of the water is deflected or broken before the water contacts the membrane which reduces the risk of damage to the membrane and also the risk of water being forced through by rupturing the membrane 12. Water is prevented from passing through into the interior of the housing through the membrane 12 since the pores in the membrane are smaller than molecules of water.

The second air passage formed by the plurality of bores 11 in the carrier is normally closed by the annular diaphragm 16 but if the pressure in the interior of the enclosure rises rapidly due, for example, to a failure in the pneumatic braking circuits, the air can flow out through the second air passage, urging diaphragm 16 to the open position, to therefore prevent the excessive air pressure damaging the membrane 12.

Although described with reference to a railway braking system, it will be appreciated that invention is applicable to many other types of installation where protection from the elements is necessary. Although described as being for the equalisation of pressure in an enclosure with atmosphere, it could be used in installations where other gases are used in other environments.

The invention claimed is:

1. An air operated brake control valve comprising an enclosure and a pressure equalization device mounted to a bore in a wall of the enclosure, the pressure equalization device comprising:
    a carrier with seals to being sealingly inserted in the bore;
    a first air passage in the carrier which provides a fluid communication between an interior of the enclosure and atmosphere;
    a barrier wall including an air permeable membrane that provides filtration of particulates for air entering the enclosure from the atmosphere, the barrier wall being sealably mounted to the carrier at a first face of the barrier wall that is most proximate to the atmosphere and extending across the entire cross section of the first passage the first passage is orthogonal to the entering air flow from the atmosphere, the barrier wall having a second, opposite face being most proximate to the interior of the enclosure and extending from the walls of the first air passage across a portion of the first air passage so as to have an area subject to the air flow in the first passage which is greater than the cross-sectional area of the first air passage at the first face;
    a second air passage in the carrier in parallel with a portion of the first air passage in the carrier for venting the enclosure; and
    the second air passage including a one-way vent valve adapted to permit air flow out of the enclosure through the second air passage but to prevent air flowing into the enclosure through the second air passage.

2. The valve according to claim 1, wherein the barrier wall is generally T-shaped.

3. The valve according to claim 1, including a carrier for the barrier wall, the carrier being sealingly insertable in the bore in the wall of the enclosure, the first air passage being formed in part by said bore.

4. The valve according to claim 1 wherein the permeable membrane forms a micro-particulate filter.

5. The valve according to claim 4, wherein the filter is formed of a polymer material.

6. The valve according to claim 1, wherein the barrier wall also forms a water barrier preventing the ingress of water into the enclosure.

7. The valve according to claim 3, further including baffle to inhibit water entering the air passage.

8. The valve according to claim 7, wherein the baffle serves to clamp the carrier to the enclosure.

9. The valve according to claim 1, wherein the one-way vent valve comprising a resilient diaphragm biased to close said second air passage and additionally being urged to a closed position by air flowing in a direction towards the enclosure and being opened against the resilient bias by air flowing out of the enclosure.

* * * * *